United States Patent
Rowe

(10) Patent No.: US 8,435,429 B2
(45) Date of Patent: May 7, 2013

(54) PROCESS FOR OPTIMUM THERMOELECTRIC PROPERTIES

(75) Inventor: Michael Paul Rowe, Pickney, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 153 days.

(21) Appl. No.: 12/841,718

(22) Filed: Jul. 22, 2010

(65) Prior Publication Data

US 2012/0018681 A1    Jan. 26, 2012

(51) Int. Cl.
*H01B 1/06* (2006.01)

(52) U.S. Cl.
USPC ... 252/519.4; 252/502; 252/506; 252/519.33; 136/201; 136/236.1; 419/48

(58) Field of Classification Search .......... 252/506, 252/519.33, 73, 502, 519.4, 59.331; 136/203, 136/239, 201, 236.1; 419/48
See application file for complete search history.

(56) References Cited

U.S. PATENT DOCUMENTS

| | | | |
|---|---|---|---|
| 7,255,846 B2* | 8/2007 | Ren et al. | 423/508 |
| 7,259,320 B2 | 8/2007 | Take | |
| 7,465,871 B2 | 12/2008 | Chen et al. | |
| 7,586,033 B2 | 9/2009 | Ren et al. | |
| 2006/0102224 A1* | 5/2006 | Chen et al. | 136/203 |
| 2006/0118158 A1 | 6/2006 | Zhang et al. | |
| 2008/0087314 A1 | 4/2008 | Xiao et al. | |
| 2011/0006249 A1* | 1/2011 | Chen et al. | 252/73 |

FOREIGN PATENT DOCUMENTS

JP    2000-332307    * 11/2000

OTHER PUBLICATIONS

U.S. Appl. No. 12/391,543, Michael Paul Rowe.

* cited by examiner

*Primary Examiner* — Khanh Tuan Nguyen
(74) *Attorney, Agent, or Firm* — Gifford, Krass, Sprinkle, Anderson & Citkowski, P.C.

(57) ABSTRACT

A process for forming a thermoelectric component having optimum properties is provided. The process includes providing a plurality of core-shell nanoparticles, the nanoparticles having a core made from silica, metals, semiconductors, insulators, ceramics, carbon, polymers, combinations thereof, and the like, and a shell containing bismuth telluride. After the core-shell nanoparticles have been provided, the nanoparticles are subjected to a sintering process. The result of the sintering provides a bismuth telluride thermoelectric component having a combined electrical conductivity and Seebeck coefficient squared of greater than 30,000 $\mu V^2 S/mK^2$ at 150° C.

7 Claims, 4 Drawing Sheets

TEM image of $Bi_2Te_3$ + $SiO_2$ composite-nanoparticles

PROCESS FOR OPTIMUM THERMOELECTRIC PROPERTIES

FIELD OF THE INVENTION

The present invention relates to a process for making a thermoelectric component, and in particular, to a process that optimizes the electrical conductivity and Seebeck coefficient for a thermoelectric component.

BACKGROUND OF THE INVENTION

Thermoelectric materials and devices can be utilized to obtain electrical energy from a thermal gradient. Such materials have a limited thermoelectric conversion efficiency which can be defined in terms of the formula $ZT=S^2\gamma/\kappa \times T$. The figure of merit (ZT) is related to the macroscopic transport parameters of the material that includes the Seebeck coefficient (S), the electrical conductivity ($\gamma$), and the thermal conductivity ($\kappa$).

In attempts to improve the thermoelectric conversion efficiency of a thermoelectric material, one can attempt to increase the Seebeck coefficient and/or the electrical conductivity while decreasing the thermal conductivity. However, increasing the ZT has proven difficult since the three parameters S, $\gamma$, and $\kappa$ are interrelated. For example, doping of a specific material can increase the electrical conductivity but decrease the Seebeck coefficient and/or increase the thermal conductivity.

Nanostructured materials have been studied to produce thermoelectric materials that have improved or higher figures of merit. However, such nanostructured materials can be difficult and expensive to manufacture, difficult to process to form a composite material, and the like. In addition, heretofore processing of such nanostructured materials has failed to provide processing parameters that optimize the properties thereof. Therefore, a process that optimizes the thermoelectric properties of a thermoelectric material would be desirable.

SUMMARY OF THE INVENTION

A process for forming a bismuth telluride thermoelectric component having optimum properties is provided. The process includes providing a plurality of core-shell nanoparticles, the nanoparticles having a core made from silica, metals, semiconductors, insulators, ceramics, carbon, polymers, combinations thereof, and the like and a shell containing bismuth (Bi) and tellurium (Te). After the core-shell nanoparticles have been provided, the nanoparticles are subjected to a sintering process in which they are sintered within a predetermined temperature range and a predetermined pressure range.

In some instances, the core is silica and the shell is $Bi_2Te_3$ doped with selenium (Se). In addition, the predetermined sintering temperature range can be between 375 and 425° C. and the predetermined pressure range between 40 to 60 MPa. In other instances, the predetermined sintering temperature range can be between 390 to 410° C. and the pressure range between 45 and 55 MPa.

DETAILED DESCRIPTION OF THE PRESENT INVENTION

The present invention provides a process for forming a thermoelectric component having optimized thermoelectric properties. As such, the present invention has utility as a process for manufacturing a thermoelectric component.

The process can include providing a plurality of core-shell nanoparticles that have a shell containing bismuth (Bi) and tellurium (Te). The core of the plurality of core-shell nanoparticles can contain a material such as silica, metals, semiconductors, insulators, ceramics, carbon, polymers, combinations thereof, and the like. Once the plurality of core-shell nanoparticles have been provided, they are subjected to a sintering process. The sintering process can include heating the plurality of core-shell nanoparticles within a predetermined temperature range at a predetermined pressure range for a given amount of time. The result of the sintering process affords for a combined value of electrical conductivity ($\gamma$) and Seebeck coefficient squared ($S^2$) of greater than 30,000 at 150° C. where $\gamma$ has units of Siemens per meter and S has units of microvolts per degree Kelvin.

In some instances, the core is silica and the shell is bismuth telluride ($Bi_2Te_3$). In addition, the $Bi_2Te_3$ can be doped with selenium (Se).

The sintering process can include sintering the material between 375 to 425° C. and/or between 40 to 60 megapascals (MPa). In addition, the temperature and/or pressure range can be smaller, i.e. more narrow, with a temperature range between 390 to 410° C. and/or pressure range between 45 to 55 MPa. The resulting sintering process can further provide a combined $\gamma \times S^2$ of greater than 30,000 $\mu V^2 S/mK^2$ at 200° C. and/or greater than 25,000 $\mu V^2 S/mK^2$ at 250° C.

Figure 1:
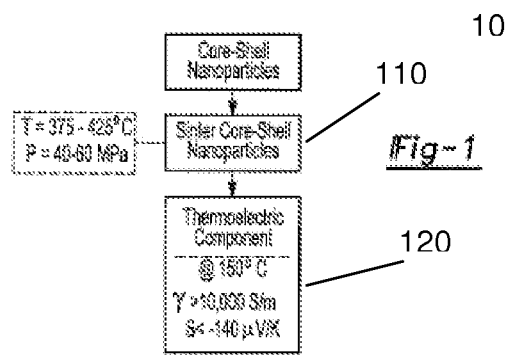
FIG. 1 is a schematic diagram illustrating a process according to an embodiment of the present invention.

Turning now to the figures, FIG. 1 provides a schematic diagram for a process for forming a thermoelectric component shown generally at reference numeral 10. The core-shell nanoparticles are sintered at step 110 and provide a thermoelectric component as shown at 120. As shown in the figure, the core-shell nanoparticles can be sintered within a temperature range of 375 to 425° C. and/or a pressure of 40 to 60 MPa. In addition, the sintering process can provide an electrical conductivity for the thermoelectric component of greater than 10,000 siemens per meter (S/m) and a Seebeck coefficient of greater than −140 microvolts per degree Kelvin ($\mu V/K$).

The nanoparticles can be made from a process that includes the steps of a) forming a core material micro-emulsion such as a reverse micelle or micelle, and b) adding at least one shell material to form composite thermoelectric nanoparticles having a core and shell structure. The at least one shell material can be included as a micro-emulsion such as a reverse micelle or micelle. The reverse micelles or micelles of the core material may or may not be combined with the reverse micelles or micelles of the shell material and the at least one shell material can include multiple shell materials mixed in a composition or included individually. In addition, the various shell materials and can be included as a solution or as reverse micelles or micelles of the various shell materials.

Various materials can be utilized for both the core and shell materials. For example and for illustrative purposes only, core materials can include materials such as metal, semiconductor, insulator, ceramic, carbon, polymer or combinations thereof. In addition, the core material can include a ceramic material such as silica, alumina, titanium dioxide, zirconium oxide and similar materials.

The shell material can include a material that has an appreciable thermoelectric effect when formed in a composite material. Examples of shell materials include chalcogenide semiconductors such as bismuth telluride or lead telluride based materials. Additional materials for the shell can include metals or semi-metals including binary, ternary and quaternary alloys of conductors, semiconductors, and insulators, compounds of silicon and germanium, skutterudite materials such as $CoSb_3$ materials, rare earth intermetallics such as $YbAl_3$, clathrate structured materials such as silicon germanium or SN framework based materials, $Mg_2Si$ and doped forms of $Mg_2Si$, half heusler alloys including MNiSn materials where M may represent Zr, Hf and Ti, multicomponent metal oxides such as $NaCo_2O_4$, $Ca_3Co_4O_9$, and other known thermoelectric materials and doping materials including groups III, IV, V, VI, and VII elements, oxides of such elements, alloys, and salts.

Figure 2:
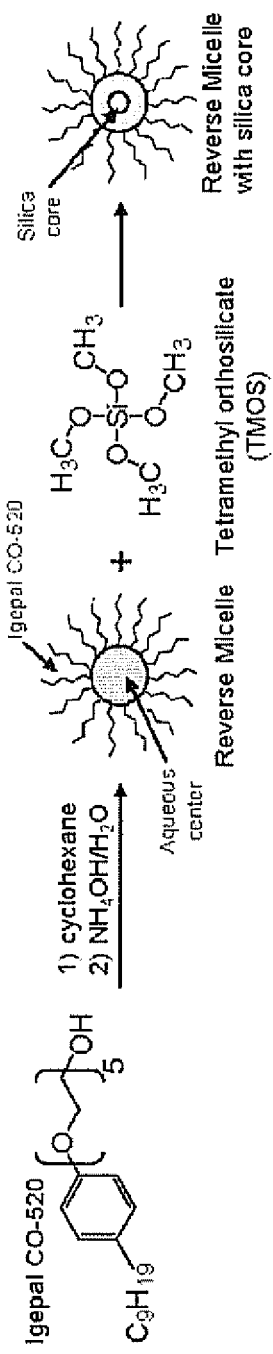
FIG. 2 is a graphical depiction of the step of forming a core material reverse micelle.

As stated above, the process can include forming a core material reverse micelle, as depicted in FIG. 2. As can be seen in FIG. 2, the step of forming a core material reverse micelle may include the steps of dissolving a surfactant in a solvent, adding a base to the dissolved solvent adjusting the PH, and then adding a core material forming a core material nanoparticle dispersed in an aqueous portion of the reverse micelle.

Figure 3:
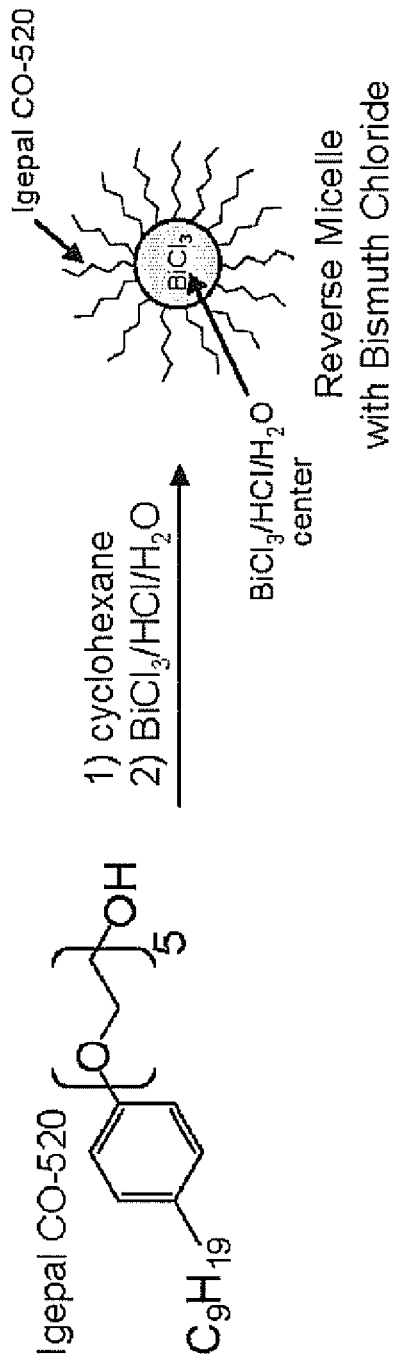
FIG. 3 is a graphical depiction of the step of forming a first shell material reverse micelle.

Referring to FIG. 3, the step of forming a shell material reverse micelle is depicted. As can be seen in FIG. 3, the step of forming a shell reverse micelle can include the step of dissolving a surfactant in a solvent, adding a shell material to the dissolved surfactant and forming a reverse micelle having an aqueous portion including the shell material.

Following the formation of the core material reverse micelle and shell material reverse micelle, the step of combining the reverse micelles of the core material and shell materials can be performed. The combination of the reverse micelles yields a reverse micelle mixture having nanoparticles of the core material dispersed in an aqueous portion of a reverse micelle that also includes the shell material.

Following the combining step described above, another shell material can be added to the reverse micelles of the previous step to form a composite thermoelectric nanoparticle having a core and shell structure. The additional shell material can be added directly to the reverse micelles or alternatively the second shell material can be combined through the use of another shell reverse micelle. In one aspect, the step of forming another shell reverse micelle can include the steps of dissolving a surfactant in a solvent and then adding another shell material to the dissolved surfactant and forming another reverse micelle having an aqueous portion including the additional shell material. It is appreciated that various numbers of shell materials can be utilized including a plurality of shell materials in a composition or individually.

The shell materials can be selected such that the ions of the shell material are reduced in the presence of another shell material such that a spontaneous alloying occurs about the core material. The core material nanoparticles can have a size of from 0.5 to 50 nanometers in diameter. Additionally, the composite thermoelectric nanoparticles having the core and shell structure can have a size of from 1.5 nanometers to 10 microns in diameter. The use of reverse micelles allows for control over the sizes and thickness of the core and shell materials in a precise manner. In addition, the shell material can spontaneously fuse to form composite thermoelectric nanoparticles having the core material nanoparticles dispersed in a matrix of the shell material due to the lack or absence of a passivating or capping ligand.

Following the formation of the core and shell nanoparticle composite various isolation and decontamination steps can be performed. For example, the process can include the step of decanting the composite thermoelectric nanoparticles following their formation. Additionally, the step of washing the composite thermoelectric nanoparticles can also be performed to minimize the amount of contaminants that may be included in the thermoelectric nanoparticles. In one aspect, the washing step can include the steps of washing the composite thermoelectric nanoparticles with an organic solvent and washing with water multiple times with each washing step followed by isolating the nanoparticles. Additional washing procedures using acids or base or water can also be performed to limit the amount of contaminants in the nanoparticles. Also, washing procedures using organic solvents like methanol can be performed.

EXAMPLES

The following examples are detailed for a process wherein $Bi_2Te_3$ shell materials are formed about a silicon dioxide core to form the composite nanoparticles. It is appreciated that various other materials can be utilized for both core and shell materials.

Example 1

Igepal CO-520 (23.332 g) is first dissolved in cyclohexane (265 mL). An aqueous solution of ammonium hydroxide (pH 10 to 11) is added (5.74 mL), and is stirred for at least 5 minutes. The solution becomes completely clear as the reverse micelles form. Tetramethyl orthosilicate (TMOS) is then added (3.35 mL). The reaction is stirred for 4 hours, during which time the TMOS diffuses from the cyclohexane phase into the aqueous cores of the reverse micelles. In the basic aqueous cores of the reverse micelles, the TMOS reacts to form silica nanoparticles ranging in size from 0.5 to 100 nm in diameter.

In a separate flask, Igepal CO-520 (32.793 g) is dissolved in cyclohexane (240 mL). A solution (33 mL) of bismuth chloride (7.794 g) in 2.5M aqueous HCl is added to this other Igepal CO-520 and cyclohexane solution. It is then stirred for 10 mins to form reverse micelles that possess aqueous cores of the aqueous bismuth chloride solution.

The two types of reverse micelles, ones containing $SiO_2$-nanoparticles and the others containing the $BiCl_3$ solution are combined and mixed to produce reverse micelles with aqueous cores containing both the $SiO_2$-nanoparticles and bismuth chloride.

A NaTeH reducing agent is synthesized as needed per synthesis. Tellurium powder (4.772 g) is added to $H_2O$ (21 mL), and the whole reaction flask is cooled in an ice bath and degassed with argon. Sodium borohydride (2.934 g) is added to the reaction in portions over ~2 minutes, and it is then stirred under argon for 12 hrs. The addition of sodium borohydride is exothermic and evolves hydrogen gas. The reaction is cooled at this step to avoid the possible ignition of the hydrogen gas being produced. The oxygen-free environment may be maintained for the NaTeH throughout the synthesis because oxygen will convert it back to tellurium metal.

A third type of reverse micelle was formed by again dissolving Igepal CO-520 (13.362 g) in cyclohexane (100 mL). The NaTeH reaction solution is added to form reverse micelles, after stirring for 10 mins, with an aqueous core containing the tellurium reducing agent.

The NaTeH reverse micelle is then mixed with the combined $SiO_2$-nanoparticle+$BiCl_3$ reverse micelle. When the NaTeH reverse micelles merge with the $SiO_2$-nanoparticle+$BiCl_3$ reverse micelles, the bismuth-ion is reduced to bismuth-metal in the presence of tellurium-metal, resulting in a spontaneous alloying around the silica-cores.

After 1 hour, the reaction solution is then decanted to collect the black precipitate. This material is washed with 200 mL acetone, 200 mL $H_2O$, 200 mL $H_2O$, and then 200 mL acetone, with centrifugation after each washing step to recover dispersed material before the black slurry is washed with the next solvent.

Figure 4:
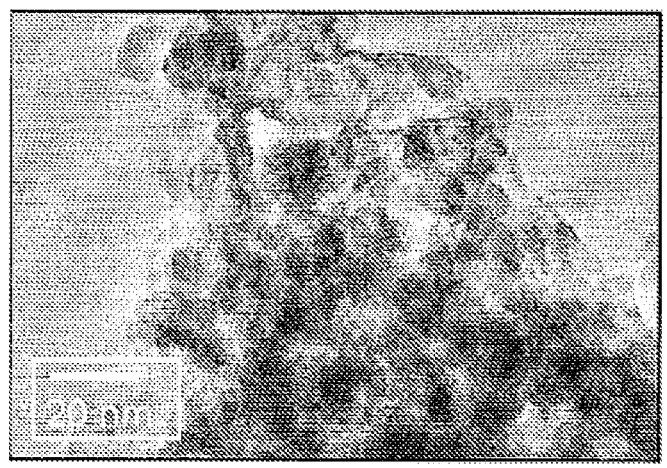
FIG. 4 is a TEM image of an aggregated bismuth telluride network having silicon oxide ($SiO_2$) nanoparticles dispersed therein.
Figure 5:
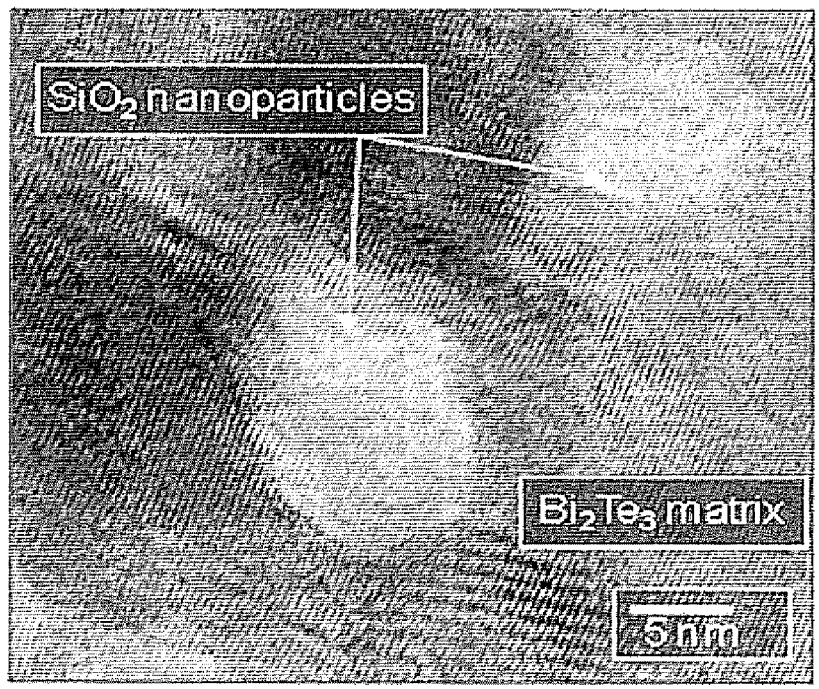
FIG. 5 is a TEM image of an aggregated bismuth telluride network having $SiO_2$ nanoparticles dispersed therein.

Referring to FIGS. 4 and 5, there are shown TEM images of the composite nanoparticles formed by the above-outlined synthesis. As can be seen in the figure, the clusters are composed of individual composite nanoparticles that have spontaneously aggregated because of the absence of surfactant or a capping agent. Additionally, the core nanoparticles of silicon dioxide having 0.5 to 100 nanometer features are dispersed within a matrix of $Bi_2Te_3$ material.

Processing parameters, that is temperature range and pressure range, have been found to provide an optimum combination for the electrical conductivity and Seebeck coefficient for a $SiO_2$ core-$Bi_2Te_3$ shell thermoelectric material. For example, FIGS. 6 and 7 provide data illustrating electrical conductivity and Seebeck coefficient, respectively, as a function of test temperature for $SiO_2$ core-$Bi_2Te_3$ shell thermoelectric material sintered using three separate conditions: 1) 400° C. and 30 MPa for 1 hour; 2) 385° C. and 50 MPa for 1 hour; and 3) 400° C. and 50 MPa for 1 hour.

Figure 6:
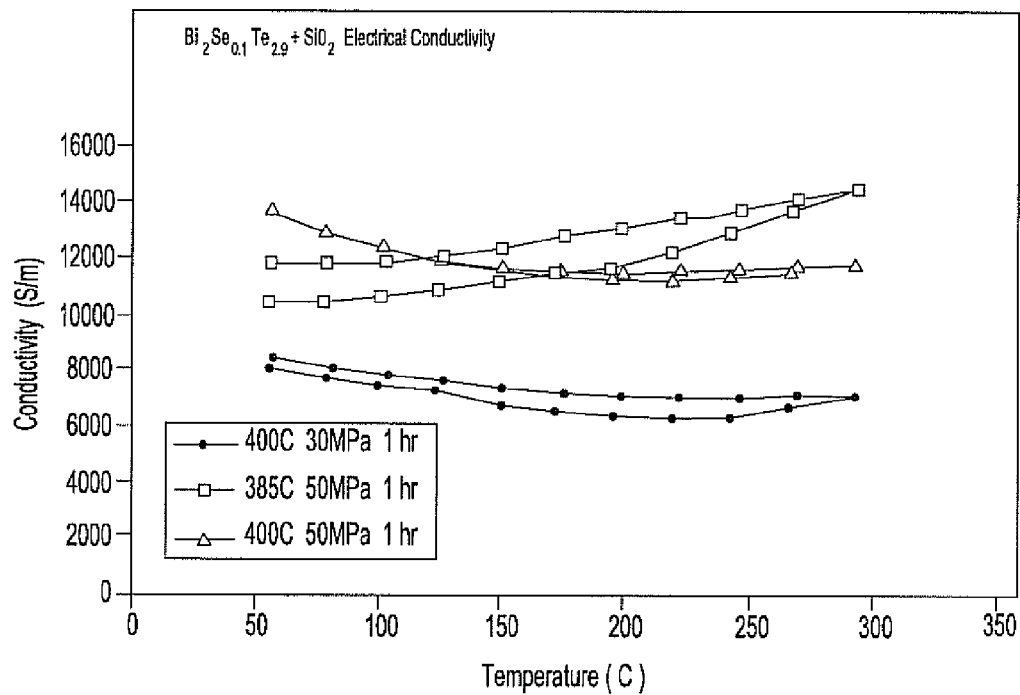
FIG. 6 is a graph illustrating electrical conductivity as a function of temperature for a thermoelectric material processed according to an embodiment of the present invention.

As shown in FIG. 6, sintering at 400° C. and 30 MPa resulted in an electrical conductivity ranging generally between 6,000 to 8,000 S/m at temperatures between 50 and 300° C. In contrast, sintering at the higher pressure of 50 MPa resulted in electrical conductivity values between 10,000 and 14,000 S/m at temperatures between 50 and 300° C. As such, it can be concluded that sintering at the lower pressure provides a material with less than desired electrical conductivity.

Figure 7:
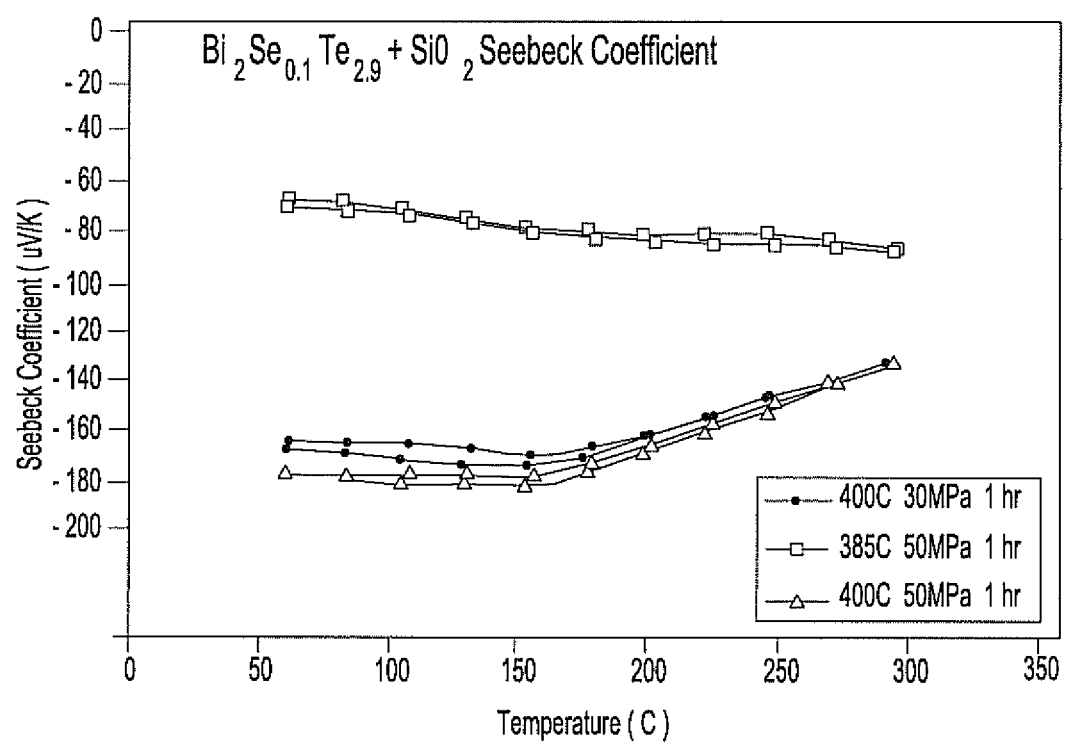
FIG. 7 is a graph illustrating Seebeck coefficient as a function of temperature for a thermoelectric material processed according to an embodiment of the present invention.

FIG. 7 illustrates sintering at the lower temperature of 385° C. and higher pressure of 50 MPa provides a material with a less than desired Seebeck coefficient. In contrast, sintering at the elevated temperature of 400° C. provided a Seebeck coefficient of between −180 and −120 μV/K for temperatures between 50 to 300° C.

An analysis of both FIGS. 6 and 7 illustrates that sintering of the $SiO_2$ core-$Bi_2Te_3$ shell thermoelectric material at 385° C. and 50 MPa can provide a material with a desired electrical conductivity, however the material exhibits a less than desired Seebeck coefficient. In addition, sintering of the material at 400° and 30 MPa provides a desired Seebeck coefficient but an undesired electrical conductivity. In contrast, material sintered at 400° C. and 50 MPa can provide a thermoelectric component having both desirable electrical conductivity and Seebeck coefficient. As such, a relationship or sintering temperature and pressure combination that provides beneficial electrical conductivity and Seebeck coefficient properties for a bismuth telluride thermoelectric material is provided.

Quantification of the benefits provided by the process 10 can include a combined $\gamma \times S^2$ value of greater than 30,000 $\mu V^2 S/mK^2$ at 150° C. In some instances, the combination of $\gamma \times S^2$ is greater than 30,000 $\mu V^2 S/mK^2$ at 200° C. In still other instances, the combination of $\gamma \times S^2$ is greater than 25,000 $\mu V^2 S/mK^2$ at 250° C. Such a combination of thermoelectric properties for a $Bi_2Te_3$ thermoelectric material can provide improved conversion efficiency of thermal gradients to electrical energy compared to heretofor known $Bi_2Te_3$ thermoelectric material.

The invention is not restricted to the illustrative examples or embodiments described above. The examples or embodiments are not intended as limitations on the scope of the invention. Methods, processes, apparatus, compositions and the like described herein are exemplary and not intended as limitations on the scope of the invention. Changes herein and other uses will occur to those skilled in the art. The scope of the invention is defined by the scope of the claims.

I claim:

1. A process for a forming a bismuth telluride thermoelectric component, the process comprising:
   providing a plurality of core-shell nanoparticles;
   the core of the plurality of core-shell nanoparticles containing a material selected from a group consisting of silica ($SiO_2$), metals, semiconductors, insulators, ceramics, carbon, polymers and combinations thereof;
   the shell of the plurality of core-shell nanoparticles containing bismuth telluride; and
   sintering the plurality of core-shell nanoparticles within a temperature range between 375° C. and 425° C. and a pressure range between 40 MPa and 60 MPa;
   the sintering resulting in a bismuth telluride thermoelectric component having a combined $\gamma \times S^2 > 30,000$ at 150° C. where $\gamma$ is the electrical conductivity in siemens per meter (S/m) and S is the Seebeck coefficient in microvolts per degree Kelvin (μV/K).

2. The process of claim 1, wherein the core contains $SiO_2$.

3. The process of claim 2, wherein the shell contains $Bi_2Te_3$.

4. The process of claim 3, wherein the shell contains $Bi_2Te_3$ doped with selenium.

5. The process of claim 1, wherein the sintering temperature range is between 390° C. and 410° C. and the sintering pressure range is between 45 MPa and 55 MPa.

6. The process of claim 1, wherein the bismuth telluride thermoelectric component has a combined $\gamma \times S^2 > 30,000$ $\mu V^2 S/mK^2$ at 200° C.

7. The process of claim 1, wherein the bismuth telluride thermoelectric component has a combined $\gamma \times S^2 > 25,000$ $\mu V^2 S/mK^2$ at 250° C.

* * * * *

UNITED STATES PATENT AND TRADEMARK OFFICE
CERTIFICATE OF CORRECTION

| | |
|---|---|
| PATENT NO. | : 8,435,429 B2 |
| APPLICATION NO. | : 12/841718 |
| DATED | : May 7, 2013 |
| INVENTOR(S) | : Michael Paul Rowe |

It is certified that error appears in the above-identified patent and that said Letters Patent is hereby corrected as shown below:

In the Claims:

At column 6, claim number 1, line number 27, After for, Delete "a".

Signed and Sealed this
Sixteenth Day of September, 2014

Michelle K. Lee
*Deputy Director of the United States Patent and Trademark Office*